United States Patent [19]

Kono et al.

[11] Patent Number: 5,021,269

[45] Date of Patent: Jun. 4, 1991

[54] METHOD FOR FORMING A METAL FILM ON THE SURFACE OF A SUBSTRATE METAL

[75] Inventors: Masanao Kono; Yoshihiro Hasegawa, both of Kakogawa; Yasutaka Nishi; Hisao Irie, both of Takasago; Tatsuji Mizuta, Kobe; Shinsuke Ohara, Kyoto, all of Japan

[73] Assignee: Harima Chemicals, Inc., Hyogo, Japan

[21] Appl. No.: 323,094

[22] Filed: Mar. 13, 1989

Related U.S. Application Data

[63] Continuation of Ser. No. 51,299, May 19, 1987, abandoned.

[30] Foreign Application Priority Data

May 19, 1986 [JP] Japan ............................... 61-114441
Jun. 30, 1986 [JP] Japan ............................... 61-154811

[51] Int. Cl.$^5$ ............................................. C23C 18/00
[52] U.S. Cl. ..................................... 427/436; 106/1.25
[58] Field of Search ..................... 106/1.25; 427/436

[56] References Cited

U.S. PATENT DOCUMENTS 2,813,805 11/1957 Kendall ............................... 106/1.25

Primary Examiner—Sam Silverberg
Attorney, Agent, or Firm—Birch, Stewart, Kolasch & Birch

[57] ABSTRACT

A method for forming a metal film on the surface of a substrate metal, which comprises soaking a substrate metal or a non-metal support carrying the substrate metal thereon in a solution of a metal salt in a high boiling point solvent under heating conditions, characterized in that the metal salt is a salt of the metal to be formed on the surface of the substrate metal with an acidic substance selected from an organic carboxylic acid, a rosin and a rosin derivative. The metal is precipitated from the solution exclusively on the surface of the substrate metal without forming any solid metal particle in the solution or on the substrate metal. Thus, the method is applicable to the formation of a soldering alloy as a film on the surface of a substrate metal without leaving thereon any free metal particle which may cause short circuits in electronic circuits. The method can thus be applied advantageously to the manufacture of electronic elements having a metal film thereon and high density printed circuits, and thus is also useful in the field of electronic industry.

14 Claims, No Drawings

METHOD FOR FORMING A METAL FILM ON THE SURFACE OF A SUBSTRATE METAL

This application is a continuation of application Ser. No. 7/051,299 filed on May 19, 1987 now abandoned.

BACKGROUND OF THE INVENTION

1. Field of the Invention

The present invention relates to a method for forming a metal film on the surface of a substrate metal, which comprises soaking a substrate metal, under a heating condition, in a solution of a salt of the metal to be coated on the substrate metal. More particularly, the present invention relates to a new method for forming a film of a soldering metal on the surface of a substrate metal, such as a printed circuit on the surface of an insulation panel, which comprises soaking the substrate metal in a solution of a specific salt of the soldering metal under a heating condition.

2. Description of the Prior Art

In general, electronic circuits are manufactured by printing a pattern of a substrate metal on a panel, forming a film of a soldering metal such as a soldering alloy on the substrate metal, laying circuit parts on the metal film and heating the whole to solder the parts and the metal film.

Heretofore, a pasty solder is known for such a purpose, which is a pasty dispersion of a powder of a soldering alloy and a flux in a high boiling point solvent such as a mineral spirit functioning as a viscosity-regulating vehicle and is used for forming a film of the soldering alloy on the substrate metal. The use of such a pasty solder for forming a film of a soldering alloy on a substrate metal of a circuit panel generally necessitates the steps of applying the pasty solder in a given configuration onto the surface of a panel having electronic parts thereon by way of screen printing or with the aid of a dispenser and heating panel to melt the powder of the soldering alloy and attach it onto the surface of the substrate metal by a cooperative action of the flux. When the pasty solder is heated, the powder of the soldering alloy is molten and any oxide existing on the surface thereof is reduced by the action of the flux to form pure molten soldering alloy particles having a clean surface. At the same time, the substrate metal on the panel is also reduced to have a clean surface. Thus, the molten soldering alloy particles are improved in their coagulating force and wettability for the substrate metal, and as the result, a film of the soldering alloy is formed on the surface of the substrate metal.

In such a pasty solder, the soldering alloy exists in the form of discrete free alloy particles separated from the flux and the solvent. The size of the particles may be very small but is still too large to form a homogeneous composition together with the flux and the solvent. Many attempts are still being made to minimize the size of the alloy particles but the size is substantially limited at present to about 10μ in diameter. The alloy particles should have a diameter of less than 1μ to form a stable homogeneous pasty solder.

In recent years, the density of printed circuits for electronic equipments becomes higher which necessitates the circuit patterns on substrates to be constructed by a number of extremely thin lines. In some cases, printed circuits are constructed by a circuit pattern having lines of several hundred microns in width at similar intervals. As the density of circuit patterns becomes higher, a pasty solder therefor should correspondingly be supplied in a more precise manner. In the case in which a pasty solder is supplied by way of screen printing for the manufacture of such high density printed circuits, a screen having a smaller mesh should be used. In the case wherein a dispenser is used for supplying a pasty solder, the use of an extrusion nozzle having a smaller diameter becomes necessary as well. Since solid particles of the soldering alloy are contained in the pasty solder as described above, the size of the particles cannot be disregarded at the time of supplying the pasty solder to substrates by way of screen printing or with the aid of a dispenser. In the case of supplying a pasty solder by way of screen printing, the solid particles of the soldering alloy contained therein often cause clogging of the screen so that it becomes difficult to supply the alloy particles homogeneously in a given configuration. Further, the friction between the alloy particles and the screen may cause damage of a mask, thus shortening the life of the screen. In the case of using a dispenser for supplying a pasty solder, the alloy particles would clog the extrusion nozzle of the dispenser whereby the clogging particles would function as a filter for the pasty solder passing through the nozzle which would permit passage of only the flux and the solvent while leaving the solid particles of the soldering alloy. This would make it extremely difficult to extrude the pasty solder wherein the alloy particles are homogeneously dispersed.

Soldering between the alloy particles and the substrate metal is attained, as described above, by a mutual coagulation force and an enhanced substrate metal-wetting property of the molten alloy particles. Since the surface tension of the individual molten alloy particles is strong, it is difficult to allow all of the alloy particles to participate in soldering. The alloy particles not participating in the soldering, would remain on the substrate panel and cause an occurrence of unexpected short circuits between the lines of the circuit pattern. Thus, a short circuit may easily be formed by the existence of even a single alloy particle between the lines constituting the circuits, which would result in a detrimental defect. To avoid such a result, it is recommended that the printed circuits be washed after soldering with an organic solvent to eliminate any residual alloy particle. Even by such washing, it is difficult to eliminate the residual alloy particles entirely from the treated circuits.

Such a drawback may be overcome more or less by reducing the diameter of the particles of the soldering alloy used. However, the reduction in the diameter of the particles makes the production cost higher and the particles in the resultant pasty solder so stable that coagulation of the alloy particles may hardly occur and would make the soldering operation itself difficult.

In order to prevent any cohesion of the alloy particles to undesirable areas which causes the formation of a short circuit. It has also been put into practice to mask with a resist all areas other than the area on which the formation of a metal film is desired, thereby forming the solder film exclusively on the desired area. Noteworthy herein is that the size of the area on which the deposition of the alloy particles is desired is almost equal to the diameter of the individual alloy particles. Thus, it is extremely also difficult in this case to supply the alloy particles precisely to the desired area for the formation of a sufficiently thick film of the soldering alloy onto the desired area.

As further means for forming a metal film on the desired areas of the substrate, a panel carrying the substrate metal thereon is masked in the undesired areas with a resist and is dipped in a molten solder bath. However, by this means, it is also extremely difficult to form a film of the soldering alloy precisely in compliance with the complicate pattern.

The above mentioned various drawbacks result apparently from their solid-liquid two phase compositions wherein solid particles of the soldering alloys are dispersed in a liquid or sol medium. It is surmised therefore that these drawbacks will be overcome if the solders are of a single homogeneous phase. Thus, in the field of solders which are used in the electronic industry, there is room for improvement in the conventional pasty solders, especially in compositions thereof. Thus, there is a strong demand for developing a new type of solder for electronic printed circuits which would overcome these drawbacks.

BRIEF SUMMARY OF THE INVENTION

Accordingly, it is an object of the present invention to provide a new method for forming a metal film on the surface of a substrate metal, which overcomes the various drawbacks of the conventional methods in which a pasty solder is used.

It is another object of the present invention to provide a method for forming a metal film on the surface of a substrate metal, wherein a homogeneous solution of a specific salt of the metal to be formed as a film on the substrate metal is used and the film is formed by precipitation of the metal from the solution.

It is still another object of the present invention to provide a method for forming a thick film of a soldering metal or alloy on the substrate metal having a high density of printed circuits.

It is further object of the present invention to provide a method for forming a film of a soldering metal or alloy on the substrate metal precisely in compliance with its complicate configuration without forming any short circuits.

Other and further objects, features and advantages of the present invention will become apparent more fully from the following description.

As a result of an extensive research made for developing a new method for forming a metal film on the surface of a substrate metal precisely in compliance with a complicate circuit pattern without forming any short circuits, it has now been found that all the drawbacks connected with the use of the conventional pasty solders for covering therewith the surface of a substrate metal constituting, for example, a high density printed circuit carried on a non-metal support as an electronic element can be overcome and a thick film of the soldering metal or alloy (the first metal) can be formed on the surface of the substrate metal (the second metal) by soaking the electronic element carrying such circuit thereon in a solution of a specific salt of the soldering metal or alloy under a heating condition and precipitating the first metal as a film on the surface of the second substrate metal, utilizing the difference in the ionization tendency between the two metals.

In accordance with the present invention, there is provided a method for forming a metal film on the surface of a substrate metal, which comprises soaking the substrate metal or the non-metal support carrying the substrate metal thereon in a solution of a metal salt in a high boiling point solvent under a heating condition, characterized in that the metal salt is a salt of the metal to be formed on the surface of the substrate metal with an acidic substance selected from an organic carboxylic acid, a rosin and a rosin derivative.

The method of the present invention for forming a metal film on the surface of a substrate metal has various features as compared with the known conventional methods wherein a pasty solder or a solder bath is used. One of the features of the method of this invention resides in the use of a homogeneous phase solution of a salt of the metal (the first metal) to be coated as a film on the surface of the substrate metal (the second metal). Another feature resides in the use of a specific acidic substance for the preparation of a salt of the first metal. A further feature resides in the relation between the first and second metals. The first and second metals are so selected that the second substrate metal is greater in ionization tendency than the first metal, which constitutes a salt with the specific acid or a substance containing such acid.

DETAILED DESCRIPTION OF THE INVENTION

According to the method of the present invention, the first metal is precipitated as a film from its salt, which had been dissolved in a solvent, on the surface of the second substrate metal precisely in compliance with its configuration. In the present invention, therefore, the first metal is first converted with an acid substance into a salt thereof which is soluble in a high boiling point solvent. The acidic substance is selected from organic carboxylic acids preferably with at least 4 carbon atoms. As the organic carboxylic acids, the following various groups of carboxylic acids are: mono-, di- and polycarboxylic acids of aliphatic nature and mono-, di- and polycarboxylic acids of aromatic nature. Among the carboxylic acids of the aliphatic nature, higher fatty acids and dicarboxylic acids are preferable. Illustrative of such preferable fatty acids and dicarboxylic acid are, for example, capric acid, lauric acid, palmitic acid, stearic acid, oleic acid, neodecanoic acid, sebacic acid, fumaric acid and maleic acid. The use of a higher fatty acid is more preferable. A variety of aromatic mono-, di- and tricarboxylic acids can be used in the present invention, wherein the use of benzoic acid, phthalic acid, isophthalic acid, trimellitic acid, pyromellitic acid and the like are preferable. Aromatic carboxylic acids contained in nature sources, such as d-pimaric acid, abietic acid and naphthenic acid are also preferably used in the present invention. Other organic carboxylic acids not mentioned herein can also be used as long as they can form a salt with the first metal and the salt is soluble in the high boiling point solvent.

In addition to these organic carboxylic acids, an acidic substance of natural origin containing abietic acid and d-pimaric acid can also be used for the preparation of salts of the first metal. Preferable examples of such substance are rosins and derivatives thereof. These substances are used as a flux for soldering from the paste and contain the above mentioned acids as their predominant ingredients. Illustrative of such rosin derivatives are, for example, disproportioned rosin, hydrogenated rosin, gum rosin, tall oil rosin and wood rosin. Further, chemically modified rosins can also be used equivalently for the preparation of the salts of the first metal. Abietic acid and d-pimaric acid contained in natural rosin and derivatives thereof have only one carboxyl group in the molecule to be bound with the metal. In the case of using a rosin for the preparation of salts with a divalent or polyvalent metal such as tin, the content of the metal in the resultant salt becomes lower. Thus, a rosin may be modified chemically to have plural carboxyl groups by introducing thereinto one or two carboxyl groups by means of addition reaction with a carboxylic acid. Preferable examples of the carboxylic acid to be introduced into the rosin by addition reaction include maleic acid and fumaric acid. An adduct obtained, for example, by the addition reaction of maleic acid to rosin which have three carboxyl groups in the molecule and can be bound with the first metal in an amount sufficient for functioning as a solder.

The first metal, i.e., the metal capable of forming a salt with the above mentioned organic carboxylic acid, a rosin or a derivative thereof (including the chemically modified rosin) is selected as a metal to be formed as a film on the surface of a substrate metal constituting an electronic part such as printed circuits. Thus, the metal is selected according to the intended use of the film formed on the substrate metal. In the case of forming a solder film on the surface of the substrate metal, tin and lead are used optionally with the cooperative alloy components such as bismuth in a given proportion. In the case of forming a silver film, a silver metal is selected as the first metal. Illustrative of the first metal are, for example, zinc, cadmium, chromium, iron, nickel, cobalt, tin, lead, bismuth, copper, silver and gold.

Salts of the first metal with the above mentioned carboxylic acid, a rosin or a derivative thereof can be prepared according to wet and dry processes. According to the wet process, the carboxylic acid, rosin or a derivative thereof is first reacted (or neutralized) in an aqueous medium with a caustic alkali such as potassium or sodium hydroxide at room temperature or at a slightly elevated temperature to form an aqueous solution of an alkali metal salt thereof. The resultant aqueous solution of the alkali metal is then reacted as such (without once isolating the solid alkaline metal salt) with an aqueous solution of a salt of the first metal at room temperature or a slightly elevated temperature whereby a double decomposition reaction takes place, yielding an aqueous solution of the desired salt of the first metal with the carboxylic acid or a rosin or a derivative thereof including an alkali metal salt as by product. The first metal salt can be isolated from this aqueous solution by removing water therefrom until dryness, extracting the residue with an aromatic solvent such as toluene or xylene for the separation of the alkali metal salt, and concentrating the extract until dryness. In this wet process, a water-soluble salt of the first metal used as the reactant is preferably derived from a strong or relatively strong acid for the double decomposition reaction. Examples of suitable strong or relatively strong acids include hydrohalic acids, especially hydrochloric acid, nitric acid and acetic acid. Sulfuric acid is also suitable if a salt derived therefrom is water-soluble. In case two or more first metals are to be formed as an alloy film on the surface of the substrate metal, the corresponding two or more first metal salts are used for the double decomposition reaction. In this case, these first metal salts may be supplied to the reaction system as a double or mixed salt or as a mixture of the individual salts which have been prepared separately and mixed in a given ratio. The use of a mixture of the individual salts is preferable since the thickness of the resultant metal film becomes greater and since the ratio of the metals can freely be varied according to the intended use.

Preferable examples of the metal salts used for the wet process (double decomposition reaction) include chlorides for zinc, cadmium, iron, nickel, cobalt, tin (stannous) and copper; sulfates for zinc, cadmium, iron, nickel, cobalt and copper; nitrates for zinc, cadmium, nickel, cobalt, copper and silver; and acetates for zinc and lead. In the case of forming a solder film, a combination of stannous chloride and lead acetate is preferably used.

According to the dry process, the carboxylic acid, the rosin or the derivative thereof is molten under an anhydrous condition together with an oxide of the first metal, while eliminating water formed during the reaction. As a variant of this process, the reactants are added to an aromatic hydrophobic solvent such as toluene or xylene and the mixture is heated until the water formed during the reaction is completely eliminated by azeotropic distillation. In either of the cases, the reaction mixture is preferably heated finally up to 220°–230° C. to complete the reaction. The dry process is called "fusion method".

This content of the first metal in its carboxylate is preferably within the range of 2–70% by weight, more preferably within the range of 10–60% by weight. This content can easily be adjusted by selecting the type of the carboxylic acid and taking the valency of the metal. If the content of the metal is too high, the metal salt may hardly be dissolved in a high boiling point solvent.

In the method of the present invention, the first metal salt is dissolved at an elevated temperature in the high boiling point solvent to form a clear homogeneous solution. The high boiling point solvent should not react with the first metal salt or attack an electronic element carrying thereon a substrate metal constituting a printed circuit. Taking such conditions into consideration, squalene or a high boiling point mineral spirit are preferably used for the method of the present invention.

At the time of preparing a solution of the metal salt, the metal content in the solution should be controlled to have a concentration of at least 0.1% by weight. If the metal content is less than 0.1% by weight, the amount of the metal will be insufficient to give a metal film having a sufficient thickness. On adjustment of the metal content in the solution in a precise manner, the solution containing a metal-enriched salt may be diluted with the solvent to reduce the concentration of the metal salt therein, or alternatively, the salt of a low metal content may be dissolved in the solvent at a high concentration.

It is important in the method of the present invention that the first metal to be coated as a film on the second or substrate metal should be smaller in ionization tendency than the second metal. In the opposite case wherein the second metal is smaller in ionization tendency than the first metal, no metal film will be formed on the substrate metal. If, for example, a film of a soldering alloy is formed on the surface of copper as the substrate, a film of tin and lead alloy will not be able to precipitate directly on the surface of the copper substrate. Even in such case, however, the formation of the tin-lead alloy film is possible by previously subjecting the copper substrate to zinc or aluminum electroplating to form a film of zinc or aluminum on the surface of the copper substrate and then forming a tin-lead alloy film on the Al- or Zn-plated copper substrate.

In accordance with the method of the present invention, the substrate metal per se or a non-metal support such as a glass or resinous base carrying the substrate metal thereon is soaked in the solution of the first metal salt under a heating condition. The soaking temperature varies according to the type of the metal salt and the boiling point of the solvent, but is generally within the range of 230°–280° C. and is about 250° C. in case of using squalene as the solvent. The soaking time also varies according to the metal salt, the soaking temperature and the thickness of the film to be formed, but is generally within the range of several seconds to several minutes. If the thickness of the metal film formed is still insufficient after the lapse of a certain period of time, the soaking time can be extended in a suitable manner.

When the substrate metal is soaked in a hot solution of the metal salt according to the method of the present invention, the metal salt is decomposed on the surface of the substrate metal whereby the first metal released from the salt is precipitated on the surface of the substrate metal to form a film. In the case in which at least two types of metal salts are used, a film of an alloy thereof will be formed on the substrate metal.

In the present invention, the mechanism of the formation of a metal film on the substrate metal merely by soaking the substrate metal in a solution of the metal salt is not clear at present, but is surmised to occur according to the following process. At the time of decomposition of the metal salt, the substrate metal functions as a catalyst therefor so that the decomposition reaction of the metal salt takes place on the surface of the substrate metal and the resultant free metal is then dissolved in the substrate metal to form an alloy layer. Next, the metal ion formed on the decomposition of the metal salt migrates and is decomposed on the surface of the substrate metal to release the free metal which is then deposited on the surface of the initially formed alloy layer to eventually form a film of the first metal on the second substrate metal.

Organic materials formed by the decomposition of the metal salts, e.g., the corresponding rosin, rosin derivative or organic acid serves as a flux and can reduce the oxidized surface of the substrate metal and promote the formation of the metal film.

According to the method of the present invention, a film of the first metal is formed easily on the surface of the second substrate metal merely by soaking the second metal in a solution of the salt of the first metal.

The operations per se for this method are very simple and necessitates no special device and equipment. The first metal participating in the formation of the metal film is combined as a salt with the organic component in the soaking solution and does not exist as the free metal particles therein. Accordingly, the method of this invention can be applied to the processing of a panel carrying thereon a precisely printed circuit pattern or a similar circuit pattern formed by masking the metal panel with a resist according to the desired pattern. Merely by soaking such panel directly in the solution of the metal salt, a metal film having a desired thickness can be formed on the substrate metal constituting the pattern with certainty and in a precise manner without washing out the pattern and without forming any short circuits with the free metal particles. In the process of forming the metal film, the metal salt moves to the surface of the substrate metal and is decomposed at that site, whereby the freed metal forms a film on the substrate metal at the same time without permitting any discrete metal particles to form in the solution or on the surface of the substrate metal. In other words, no discrete metal particles exist in the system throughout the process and the metal component in the solution is wholly utilized for the formation of the metal film. Accordingly, the freed metal is concentrated exclusively onto the exposed area of the substate metal where a metal film having a sufficient thickness is formed, even if the metal content in the solution is small. The method of the present invention is distinguished by the use of a homogeneous system containing the metal salt dissolved therein and by the simplified operation, and thus attains a very high efficiency not seen in the prior art.

In view of the excellent merits of the present invention especially featured by the use of a homogeneous liquid phase free of any solid metal particle and by the concentration of the metal exclusively onto the exposed area of the substrate metal, the method of the present invention is applicable not only to the soldering of electronic circuits and parts but also to the preparation of high density integrated circuits and LSI. Further, the method of this invention is particularly useful for connecting leader wire to IC and LSI. Moreover, the method of the present invention can widely be utilized in various fields of industry, apart from the electronic industry, e.g., for forming a metal film on the surface of metallic ornamental goods and metallized plastic articles.

The present invention will now be illustrated in more detail by way of examples.

EXAMPLE 1

In a 200 ml 4-necked flash equipped with a water-separator, a condensor, a thermometer and a stirrer are placed 125 g of naphthenic acid (acid value: 224). After elevating the inner temperature up to 170°–180° C., 10.1 g of stannous oxide and 5.9 g of lead monoxide are added to the acid. After elevating the inner temperature up to 220°–230° C., the mixture is reacted for 3 hours at the same temperature whereby stannous and lead naphthenates are obtained which, respectively, has a tin content of 6.3% by weight and a lead content of 3.9% by weight.

EXAMPLE 2

An operation is carried out in the same manner as illustrated in Example 1 except that 90 g of neodecanoic acid as the organic carboxylic acid is used in place of the naphthenic acid used in Example 1, whereby stannous and lead neodecanoates are obtained which, respectively, has a tin content of 8.4% by weight and a lead content of 5.2% by weight.

EXAMPLE 3

An operation is carried out in the same manner as illustrated in Example 1 except that 142 g of stearic acid as the organic carboxylic acid is used in place of the naphthenic acid used in Example 1, whereby stannous and lead stearates are obtained which, respectively, has a tin content of 5.6% by weight and a lead content of 3.5% by weight.

EXAMPLE 4

In a 300 ml 4-necked flash equipped in a water-separator, a condenser, a thermometer and a stirrer are placed 122 g of benzoic acid and 40 g of xylene. After elevating the inner temperature up to 120°–130° C. while stirring the mixture, 20.2 g of stannous oxide and 11.8 g of lead monoxide are added to the mixture. After elevating the inner temperature up to 220°-230° C. while eliminating the xylene, the mixture is reacted together for 3 hours at the same temperature whereby stannous and lead benzoates are obtained which, respectively, has a tin content of 11.6% by weight and a lead content of 7.1% by weight.

EXAMPLE 5

In a 2-liter beaker equipped with a stirrer are placed 125 g of naphthenic acid (acid value: 224), 59 g of a 48% aqueous solution of caustic potash and 1247 g of water. A reaction is carried out for 2 hours at 30° C. with stirring to obtain an aqueous solution of potassium naphthenate having a pH value of 10.5 and containing 10.2% by weight of a solid matter.

On the other hand, 38 g of stannous chloride, 26 g of lead acetate and 200 g of water are charged into a 500 ml beaker equipped with a stirrer and the metal salts are dissolved into the water with stirring. This aqueous solution of the metal salts is added to the aforesaid aqueous solution of potassium naphthenate and a double decomposition reaction is then carried out for 1 hour at 30° C. The reaction mixture is dehydrated, dried and then extracted with toluene. The residue is heated under a reduced pressure of 10 mm Hg to distill off the toluene whereby stannous and lead naphthenates are obtained which, respectively has a tin content of 13.2% by weight and a lead content of 9.2% by weight.

EXAMPLE 6

In a 2-liter beaker equipped with a stirrer are placed 141 g of oleic acid (acid value: 198), 59 g of a 48% aqueous solution of caustic potash and 1406 g of water. A reaction is carried out for 2 hours at 30° C. with stirring to obtain an aqueous solution of potassium oleate having a pH value of 10.4 and containing 10.1% by weight of a solid matter.

On the other hand, 38 g of stannous chloride, 26 g of lead acetate and 200 g of water are charged into a 500 ml beaker equipped with a stirrer and the metal salts are dissolved into the water with stirring. This aqueous solution of the metal salts is added to the aforesaid aqueous solution of potassium oleate and a double decomposition reaction is then carried out for 1 hour at 30° C. The reaction mixture is dehydrated, dried and then extracted with toluene. The residue is heated under a reduced pressure of 10 mm Hg to distill off the toluene whereby stannous and lead oleates are obtained which, respectively, has a tin content of 12.0% by weight and a lead content of 8.4% by weight.

EXAMPLE 7

An operation is carried out in the same manner as illustrated in Example 6 except that 42 g of cupric chloride is used as the metal salt for double decomposition, whereby cupric oleate is obtained which has a copper content of 10.4% by weight.

EXAMPLE 8

An operation is carried out in the same manner as illustrated in Example 6 except that 62.3 g of nickel chloride (6 hydrate) is used as the metal salt for double decomposition, whereby nickel oleate is obtained which has a nickel content of 9.1% by weight.

EXAMPLE 9

An operation is carried out in the same manner as illustrated in Example 6 except that 85 g of silver nitrate is used as the metal salt for double decomposition, whereby silver oleate is obtained which has a silver content of 27.7% by weight.

EXAMPLE 10

In a 2-liter beaker equipped with a stirrer are placed 100 g of phthalic acid, 141 g of a 48% aqueous solution of caustic potash and 1230 g of water. A reaction is carried out for 2 hours at 30° C. with stirring to obtain an aqueous solution of potassium phthalate having a pH value of 10.3 and containing 10.1% by weight of a solid matter.

On the other hand, 215 g of silver nitrate and 200 g of water are charged into a 500 ml beaker equipped with a stirrer and the metal salt was dissolved into the water with stirring. This aqueous solution of silver nitrate is added to the aforesaid aqueous solution of potassium phthalate and a double decomposition reaction is then carried out for 1 hours at 30° C. The reaction mixture is dehydrated, dried and then extracted with toluene. The residue is heated under a reduced pressure of 10 mm Hg to distill off the toluene whereby 225 g of silver phthalate is obtained which has a silver content of 53.5% by weight.

EXAMPLE 11

A reaction is carried out in the same manner as illustrated in Example 10 except that 100 g of isophthalic acid is used in place of the phthalic acid used in Example 10, whereby an aqueous solution of potassium isophthalate having a pH value of 10.2 and containing 10.0% by weight of a solid matter is obtained, which is then subjected to a double decomposition reaction conducted in the same manner as illustrated in Example 10 to obtain 230 g of silver isophthalate having a silver content of 51.5% by weight.

EXAMPLE 12

A mixture of 100 g of sebacic acid, 116 g of a 48% aqueous solution of caustic potash and 1171 g of water is subjected to reaction conducted in the same manner as illustrated in Example 10 to obtain an aqueous solution of potassium sebacate having a pH value of 10.1 and containing 10.1% by weight of a solid matter. To this aqueous solution is added an aqueous solution of 177 g of silver nitrate in 200 g of water to effect a double decomposition reaction in the same manner as illustrated in Example 10 whereby 195 g of silver sebacate is obtained which has a silver content of 49.8% by weight.

EXAMPLE 13

A mixture of 100 g of fumaric acid, 201 g of a 48% aqueous solution of caustic potash and 1370 g of water is subjected to reaction conducted in the same manner as illustrated in Example 10 to obtain an aqueous solution of potassium fumarate having a pH value of 10.5 and containing 10.3% by weight of a solid matter. To this aqueous solution of potassium fumarate is added an aqueous solution of 308 g of silver nitrate in 300 g of water to effect a double decomposition reaction in the same manner as illustrated in Example 10 whereby 275 g of silver fumarate is obtained which has a silver content of 61.3% by weight.

EXAMPLE B 14

A mixture of 100 g of trimellitic acid anhydride, 183 g of a 48% aqueous solution of caustic potash and 1330 g of water is subjected to reaction conducted in the same manner as illustrated in Example 10 to obtain an aqueous solution of potassium salt of trimellitic acid anhydride having a pH value of 10.2 and containing 10.1% by weight of a solid matter. To this aqueous solution is added an aqueous solution of 279 g of silver nitrate in 270 g of water to effect a double decomposition reaction in the same manner as illustrated in Example 10 whereby 246 g of silver salt of trimellitic acid anhydride is obtained which has a silver content of 57.5% by weight.

EXAMPLE 15

A mixture of 100 g of pyromellitic anhydride, 214 g of a 48% aqueous solution of Caustic potash and 1400 g of water is subjected to reaction conducted in the same manner as illustrated in Example 10 to obtain an aqueous solution of potassium salt of pyromellitic acid having a pH value of 10.4 and containing 10.0% by weight of a solid matter. To this aqueous solution is added an aqueous solution of 328 g of silver nitrate in 300 g of water to effect a double decomposition reaction in the same manner as illustrated in Example 10 whereby 265 g of silver salt of pyromelletic acid is obtained which has a silver content of 59.8% by weight.

EXAMPLE 16

In a 200 ml 4-necked flask equipped with a water-separator, a condenser, a thermometer and a stirrer is placed 100 g of oleic acid. After elevating the inner temperature up to 170°–180° C., 3.7 g of stannous oxide and 2.4 g of lead monoxide are added to the acid. After elevating the inner temperature up to 220°–230° C., the mixture is reacted together for 3 hours at the same temperature whereby stannous and lead oleates are obtained which, respectively, has a tin content of 2.9% by weight and a lead content of 1.8% by weight.

EXAMPLE 17

An operation is carried out in the same manner as illustrated in Example 16 except that the amounts of the stannous oxide and lead monoxide used in Example 16 are 0.8 g and 0.5 g, respectively, whereby stannous and lead oleates are obtained which, respectively, has a tin content of 0.61% by weight and a lead content of 0.39% by weight.

EXAMPLE 18

In a 1 liter 4-necked flask equipped with a condenser and a stirrer are placed 175 g of a gum rosin produced in China (acid value: 169; tint: grade X; softening point: 78.C), 63 g of a 48% aqueous solution of caustic potash and 374 g of water. A reaction of the mixture is carried out for 3 hours at 90° C. with stirring to obtain an aqueous solution of potassium salt of the gum rosin having a pH value of 10.5 and containing 30.5% of a solid matter.

A 2 liter beaker equipped with a stirrer is charged with 600 g of the aqueous solution of the potassium salt of the gum rosin obtained in the preceding step and 850 g of water to dilute the aqueous solution under agitation. On the other hand, 38 g of stannous chloride, 26 g of lead acetate and 200 g of water are charged into a 500 ml beaker equipped with a stirrer and the metal salts are dissolved in the water with stirring. This aqueous solution of the metal salts is added to the aforesaid diluted aqueous solution of potassium salt of the gum rosin, and a double decomposition reaction is then carried out for 1 hour at 30° C. The reaction mixture is dehydrated and dried to obtain stannous and lead salts of the gum rosin having a tin content of 9% by weight and a lead content of 5.8% by weight, respectively.

EXAMPLE 19

An operation is carried out in the same manner as illustrated in Example 18 except that 84 g of silver nitrate is used in place of stannous chloride and lead acetate as metal salts for double decomposition, whereby silver salt of the gum rosin is obtained which has a silver content of 21% by weight.

EXAMPLE 20

An operation is carried out in the same manner as illustrated in Example 18 except that 42 g of cupric chloride is used in place of stannous chloride and lead acetate in case of double decomposition, whereby cupric salt of the gum rosin is obtained which has a copper content of 14% by weight.

EXAMPLE 21

An operation is carried out in the same manner as illustrated in Example 18 except that tall oil rosin (acid value: 168.5; tint: grade X; softening point: 76° C.) is used in place of the gum rosin produced in China, whereby stannous and lead salts of the tall oil rosin are obtained which has a tin content of 8.8% by weight and a lead content of 5.8% by weight.

EXAMPLE 22

An operation is carried out in the same manner as illustrated in Example 18 except that asymmetric rosin (acid value: 167.0; tint: grade WG; softening point: 68° C.) is used in place of the gum rosin produced in China, whereby stannous and lead salts of the asymmetric rosin is obtained which, respectively, has a tin content of 8.5% by weight and a lead content of 5.5% by weight.

EXAMPLE 23

In a 500 ml 4-necked flask equipped with a condenser, a water-separator, a thermometer and a stirrer is placed 300 g of tall oil rosin (acid value: 168; tint: grade X; softening point: 76° C). The flask is heated with stirring on a mantle heater to melt the rosin. The molten rosin is once cooled down to 180° C., admixed with 57 g of maleic anhydride. The mixture is heated for 2 hours at 190°–200° C. to effect a maleic anhydride-addition reaction whereby 350 g of a maleic anhydride-adduct of the rosin is obtained which has an acid value of 324.

In a 1 liter 4-necked flask equipped with a condenser and a stirrer are palced 175 g of the maleic anhydride-adduct of the rosin obtained in the preceding step, 120 g of a 48% aqueous solution of caustic potash and 318 g of water. A reaction of the mixture is carried out for 3 hours at 90° C. with stirring to obtain an aqueous solution of potassium salt of the maleic anhydride-adduct of the rosin having a pH value of 10.3 and containing 30% of a solid matter.

A 2 liter beaker equipped with a stirrer is charged with 600 g of the aqueous solution of the potassium salt of the maleic anhydride-adduct of the rosin obtained in the preceding step and 850 g of water to dilute the aqueous solution under agitation. On the other hand, 69 g of stannous chloride, 45 g of lead acetate and 200 g of water are charged into a 500 ml beaker equipped with a stirrer and the metal salts are dissolved in the water with stirring. This aqueous solution of the metal salts is added to the aforesaid diluted aqueous solution of potassium salt of the maleic anhydride-adduct of the rosin, and a double decomposition reaction is then carried out for 1 hour at 30° C. The reaction mixture is dehydrated and dried to obtain stannous and lead salts of the maleic anhydride-adduct of the rosin having a tin content of 17% by weight and a lead content of 12% by weight, respectively.

EXAMPLE 24

In a 500 ml 4-necked flask equipped with a condenser, a water-separator, a thermometer and a stirred is placed 300 g of tall oil rosin (acid value: 168; tint: grade X; softening point: 76° C.). The flask is heated with stirring on a mantle heater to melt the rosin. The molten rosin is once cooled down to 180° C., admixed with 24 g of fumaric acid. The mixture is heated for 2 hours at 190°-200° C. to effect a fumaric acid- addition reaction whereby 320 g of a fumaric acid-adduct of the rosin is obtained which has a neutralization value of 226.

In a 1 liter 4-necked flask equipped with a condenser and a stirred are placed 175 g of the fumaric acid-adduct of the rosin obtained in the preceding step, 83 g of a 48% aqueous solution of caustic potash and 417 g of water. A reaction of the mixture is carried out for 3 hours at 90° C. with stirring to obtain an aqueous solution of potassium salt of the fumaric acid-adduct of the rosin having a pH value of 10.3 and containing 30% of a solid matter.

A 2 liter beaker equipped with a stirrer is charged with 600 g of the aqueous solution of the potassium salt of the fumaric acid-adduct of the rosin obtained in the preceding step and 850 g of water to dilute the aqueous solution under agitation. On the other hand, 43 g of stannous chloride, 28 g of lead acetate and 200 g of water are charged into a 500 ml beaker equipped with a stirrer and the metal salts are dissolved in the water with stirring. This aqueous solution of the metal salts is added to the aforesaid diluted aqueous solution of potassium salt of the fumaric acid-adduct of the rosin, and a double decomposition reaction is then carried out for 1 hour at 30° C. The reaction mixture is dehydrated and dried to obtain stannous and lead salts of the fumaric acid-adduct of the rosin having a tin content of 13% by weight and a lead content of 9% by weight, respectively.

EXAMPLE 25

In a 1 liter 4-necked flask equipped with a water-separator, a condenser, a thermometer and a stirrer is placed 300 g of a gum rosin produced in China (previously described). The flask is heated to melt the rosin at 220°-230° C. while eliminating water. To the melt are added 20.3 g of stannous oxide and 13.0 g of lead monoxide, and the mixture is reacted together for 3 hours at the same temperature whereby stannous and lead salts of the gum rosin are obtained which, respectively, has a tin content of 5.5% by weight and a lead content of 3.8% by weight.

EXAMPLE 26

An operation is carried out in the same manner as illustrated in Example 25 except that the amounts of stannous oxide and lead monoxide used in Example 25 are 10.0 g and 6.5 g, respectively, whereby stannous and lead salts of the gum rosin is obtained which, respectively, has a tin content of 2.8% by weight and a lead content of 1.8% by weight.

EXAMPLE 27

An operation is carried out in the same manner as illustrated in Example 25 except that the amounts of stannous oxide and lead monoxide used in Example 25 are 0.55 g and 0.4 g, respectively, whereby stannous and lead salts of the gum rosin is obtained which, respectively, has a tin content of 0.55% by weight and a lead content of 0.4% by weight.

The following example illustrates the method for forming a metal film on a substrate metal, using the metal salts of the organic carboxylic acids or rosin or derivatives thereof obtained in the foregoing Examples 1-27.

EXAMPLE 28

(1) Preparation of a Solution of the Metal Salt

In a 200 ml 4-necked flask equipped with a thermometer and a stirrer are placed 90 g of squalene and the metal salts of the organic carboxylic acids or of rosin or derivatives thereof synthesized in each of the foregoing Examples. The mixture is stirred for 60 minutes at 100° C. to dissolve the metal salts in the squalene. The amount of the metal salts used is adjusted so that the concentration of the metal component in the metal salts in the solution is about 1.4% by weight. In case of Examples 16 and 17, however, the concentration of the metals in the solution is adjusted to 0.2% by weight and 0.05% by weight, respectively. In case of Example 27, the concentration of the metals is adjusted to 0.2% by weight and 0.05% by weight.

Using a high boiling point mineral oil (Shell Flex #371, Shell Sekiyu KK, Japan) in place of squalene, similar solutions of the metal salts of Examples 1 and 18 are prepared in the same manner as described above.

(2) Soaking of the Substrate Metal

Zinc, aluminum, iron, nickel and copper are used as the substrate metal. A panel (30 mm × 30 mm × 0.1 mm) of each substrate metal is soaked for 60 seconds in the solution of the metal salts heated at 250° C.

(b 3) Measurement of the Thickness of a Metal Film Formed

The thickness of the metal panel is measured by the aid of a micrometer before and after the soaking treatment to calculate the thickness of a metal film formed on one side of the metal panel.

(4) Result of the Test

A result of the test is shown in Tables 1 and 2 wherein the symbol o stands for the case wherein the thickness of the metal film is at least $3\mu$, the symbol Δ for the case wherein the thickness of the metal film is less than $3\mu$ and the symbol x for the case wherein any metal film is not formed.

TABLE 1

| Examples | Acids | Metals | Method for syntheses | Solvents | Contents of metals | Types of substrate metal | | | | |
|---|---|---|---|---|---|---|---|---|---|---|
| | | | | | | Zn | Al | Fe | Ni | Cu |
| Example 1 | Naphthenic acid | Sn, Pb | Fusion (dry) | Squalene | 1.4 | o | o | o | o | x |
| Example 2 | Neodecanoic acid | Sn, Pb | Fusion (dry) | Squalene | 1.4 | o | o | o | o | x |
| Example 3 | Stearic acid | Sn, Pb | Fusion (dry) | Squalene | 1.4 | o | o | o | o | x |
| Example 4 | Benzoic acid | Sn, Pb | Fusion (dry) | Squalene | 1.4 | o | o | o | o | x |
| Example 5 | Naphthenic acid | Sn, Pb | Double decomposition (wet) | Squalene | 1.4 | o | o | o | o | x |
| Example 6 | Oleic acid | Sn, Pb | Double decomposition (wet) | Squalene | 1.4 | o | o | o | o | x |
| Example 7 | Oleic acid | Cu | Double decomposition (wet) | Squalene | 1.4 | o | o | o | o | x |
| Example 8 | Oleic acid | Ni | Double decomposition (wet) | Squalene | 1.4 | o | Δ | Δ | x | x |
| Example 9 | Oleic acid | Ag | Double decomposition (wet) | Squalene | 1.4 | o | o | o | o | o |
| Example 10 | Phthalic acid | Ag | Double decomposition (wet) | Squalene | 1.4 | o | o | o | o | o |
| Example 11 | Isophthalic acid | Ag | Double decomposition (wet) | Squalene | 1.4 | o | o | o | o | o |
| Example 12 | Sebacic acid | Ag | Double decomposition (wet) | Squalene | 1.4 | o | o | o | o | o |
| Example 13 | Fumaric acid | Ag | Double decomposition (wet) | Squalene | 1.4 | o | o | o | o | o |
| Example 14 | Trimellitic acid | Ag | Double decomposition (wet) | Squalene | 1.4 | o | o | o | o | o |
| Example 15 | Pyromellitic acid | Ag | Double decomposition (wet) | Squalene | 1.4 | o | o | o | o | o |
| Example 16 | Oleic acid | Sn, Pb | Fusion (dry) | Squalene | 0.2 | o | Δ | Δ | Δ | x |
| Example 17 | Oleic acid | Sn, Pb | Fusion (dry) | Squalene | 0.05 | Δ | Δ | Δ | Δ | x |
| Example 1 | Naphthenic acid | Sn, Pb | Fusion (dry) | High boiling point mineral oil | 1.4 | o | o | o | o | x |

TABLE 2

| Examples | Solvent | Contents of metals | Types of substrate metal | | | | |
|---|---|---|---|---|---|---|---|
| | | | Zn | Al | Fe | Ni | Cu |
| Example 18 | Squalene | 1.4 | o | o | o | o | x |
| Example 19 | Squalene | 1.4 | o | o | o | o | o |
| Example 20 | Squalene | 1.4 | o | o | o | o | Δ |
| Example 21 | Squalene | 1.4 | o | o | o | o | x |
| Example 22 | Squalene | 1.4 | o | o | o | o | x |
| Example 23 | Squalene | 1.4 | o | o | o | o | x |
| Example 25 | Squalene | 1.4 | o | o | o | o | x |
| Example 26 | Squalene | 1.4 | o | o | o | o | x |
| Example 27 | Squalene | 0.2 | o | o | o | Δ | x |
| Example 27 | Squalene | 0.05 | Δ | Δ | Δ | Δ | x |
| Example 18 | High boiling point mineral oil | 1.4 | o | o | o | o | x |

In case the thickness of the metal film is at least $3\mu$, it is possible to bind two panels of the substrate metal by contacting them in such manner that the sides of the panels having the metal film face each other, and then heating the contacted panels of the substrate metal. In case the thickness of the metal film is less than $3\mu$, it is difficult to bind two panels of the substrate metal as such. It is surmised, however, that the thickness of the metal film may be increased by prolonging the soaking time of the panels of the substrate metal. In case of no metal film being formed, it is considered that any metal film having a sufficient thickness will not be formed even if the soaking time is prolonged.

The following facts are apparently revealed from the results shown in Tables 1 and 2:

(a) The substrate metal should be larger in ionization tendency than the metal constituting the metal salt of an organic carboxylic acid or of rosin or a derivative thereof.

(b) The metal content in a solution of the metal salt should preferably be at least 1% by weight.

The following example illustrates the practical, remarkable usefulness of the metal film formed according to the present invention in comparison with a similar metal film formed according to a conventional soldering method.

EXAMPLE 29

A test circuit substrate is prepared by printing, on a panel made of a glass fiber-reinforced epoxy resin, two comb-like patterns having 10 lines of 1 mm in width and 10 mm in length in such manner that the individual lines are arranged parallel to one another at an interval of 0.1 mm on the panel. The test circuit substrate thus prepared is subjected to nickel electroplating to plate the lines with nickel and then soaked in the squalene solution of the metal salts described in Example 1 (the content of the metal: 1.4% by weight) at 250° C. for 30 minutes to form a metal film of about 30μ in thickness on the surface of the nickel-plated lines.

In a Comparative Example, a pasty solder is applied onto the surface of the test circuit substrate by an applicator, and the substrate is then heated to melt the solder to form a solder film of about 30μ in thickness on the surface of the nickel-plated lines for the purpose of comparison.

Each test circuit substrate having the metal film thereon is microscopically observed to check whether or not any short circuit exists between the parallel arrangement of lines. As a result of the above inspection, no short circuit was found in the circuit substrate treated in accordance with the method of the present invention, and this fact was corroborated by no conductivity occurring on actual sending of electricity between the two comb-like patterns.

A similar result is obtained when the metal salts of Example 1 is replaced with those described in Example 18 in the foregoing treatment. In contrast, the circuit substrate obtained in the Comparative Example wherein the circuit is treated with a conventional solder has many short circuits due to the large number of coagulated solder granules bridging the lines, including spread solder films which have integrally covered several lines.

It is understood that the preceding representative examples may be varied within the scope of the present specification both as to the type of the metal salts and the treating conditions by those skilled in the art to achieve essentially the same results.

As many widely different embodiments of the present invention may be made without departing from the spirit and scope thereof, it is to be construed that the present invention is not limited to the specific embodiments thereof except as defined in the appended claims.

What is claimed is:

1. A method for forming a soldering alloy film on the surface of a circuit panel metal substrate for electronic parts, which comprises soaking the metal substrate or a non-metal support having the metal substrate disposed thereon in a solution of a soldering alloy salt in a high boiling point solvent, at a temperature of from about 230° to 280° C., characterized in that the soldering alloy salt is a salt of a soldering alloy, which is the soldering alloy to be formed on the surface of the metal substrate, and an acidic substance selected from the group consisting of an organic carboxylic acid having at least 4 carbon atoms, an acidic substance of natural origin containing abietic acid and d-pimaric acid and that which has been modified to contain 2 or 3 carboxyl groups, wherein the metal substrate is larger in ionization tendency than the soldering alloy to be formed on the surface of the metal substrate.

2. The method according to claim 1, wherein the soldering alloy to be formed on the surface of the metal substrate is comprised of at least two of the metals selected from the group consisting of zinc, cadmium, chromium, iron, nickel, cobalt, tin, lead, bismuth, copper, silver and gold.

3. The method according to claim 1, wherein the soldering alloy to be formed on the surface of the metal substrate is a mixture of tin and lead.

4. The method according to claim 1 wherein the metal of the metal substrate is selected from the group consisting of zinc, aluminum, iron, nickel and copper.

5. The method according to claim 14, wherein the metal of the metal substrate is copper.

6. The method according to claim 1, wherein the non-metal support is a glass or a resinous base.

7. The method according to claim 14, wherein the solvent is squalene and the soaking temperature is 250° C.

8. The method according to claim 1 wherein the soaking time is from several seconds to several minutes.

9. The method according to claim 1, wherein the organic carboxylic acid having at least 4 carbon atoms is an aromatic mono-carboxylic acid or a di-carboxylic acid.

10. The method according to claim 1, wherein the organic carboxylic acid having at least 4 carbon atoms is a fatty acid.

11. The method according to claim 1, wherein the acidic substance of natural origin are rosins and derivatives thereof.

12. The method according to claim 11, wherein the rosin derivative is selected from the group consisting of a disproportioned rosin, a hydrogenated rosin, a gum rosin, a tall oil rosin, a wood rosin, a maleic acid-adduct of rosin and a fumaric acid-adduct of rosin.

13. The method according to claim 1, wherein the soldering alloy content in the solution is at least 0.1% by weight.

14. The method according to claim 1, wherein the high boiling point solvent is selected from the group consisting of squalene and high boiling point mineral spirits.

* * * * *